US012300869B2

(12) United States Patent
Maimon et al.

(10) Patent No.: US 12,300,869 B2
(45) Date of Patent: May 13, 2025

(54) DIRECTIONAL COUPLER COMPRISING A FIRST LINEAR CONDUCTOR COUPLED TO A SECOND WINDING CONDUCTOR, SUCH THAT THE FIRST CONDUCTOR HAS A LENGTH LESS THAN ONE-QUARTER WAVELENGTH

(71) Applicant: Intel Corporation, Santa Clara, CA (US)

(72) Inventors: Tzvi Maimon, Kiryat Shmuel (IL); Tamir Levinger, Haida District (IL); Fabian Cossoy, Atlit (IL)

(73) Assignee: Intel Corporation, Santa Clara, CA (US)

( * ) Notice: Subject to any disclaimer, the term of this patent is extended or adjusted under 35 U.S.C. 154(b) by 821 days.

(21) Appl. No.: 17/347,621

(22) Filed: Jun. 15, 2021

(65) Prior Publication Data

US 2022/0399629 A1 Dec. 15, 2022

(51) Int. Cl.
*H01P 5/18* (2006.01)
*H03F 3/189* (2006.01)
(Continued)

(52) U.S. Cl.
CPC ............. *H01P 5/187* (2013.01); *H01P 5/18* (2013.01); *H01P 5/182* (2013.01); *H03F 3/189* (2013.01); *H03F 3/20* (2013.01); *H04B 1/38* (2013.01)

(58) Field of Classification Search
CPC ............. H01P 5/187; H01P 5/182; H01P 5/18
(Continued)

(56) References Cited

U.S. PATENT DOCUMENTS 5,487,184 A * 1/1996 Nagode ............... H01P 5/187
333/116
10,181,631 B2 * 1/2019 Frederick ............... H03H 7/38
(Continued)

OTHER PUBLICATIONS

Bunea, Alina-Cristina et al.; "Metamaterial millimeter wave devices on silicon substrate: Band-pass filter and directional coupler"; https://ieeexplore.ieee.org/document/5929222; IEEE, Apr. 27-29, 2011; 4 pages; 2011 IEEE EUROCON—International Conference on Computer as a Tool; Lisbon; Portugal.

(Continued)

*Primary Examiner* — Benny T Lee
(74) *Attorney, Agent, or Firm* — Viering, Jentschura & Partner mbB

(57) ABSTRACT

A signal coupling system may include a directional coupler that includes a first conductor and a second conductor. The first conductor may include a first end and a second end and may be generally arranged along a first plane. The second conductor may include a third end and a fourth end and may generally be arranged as a plurality of windings along a second plane. The signal coupling system may also include a transceiver, electrically conductively conducted to the first end; and an antenna, electrically conductively conducted to the second end. The second conductor may be configured to generate a coupling with the first conductor when the first conductor conducts an electric signal, such that the coupler conducts a first electrical signal from the first end to the second end at a second power, and conducts the electrical signal via the coupling to the third end at a third power.

18 Claims, 8 Drawing Sheets

(51) Int. Cl.
*H03F 3/20* (2006.01)
*H04B 1/38* (2015.01)

(58) Field of Classification Search
USPC .................................................. 333/116, 109
See application file for complete search history.

(56) References Cited

U.S. PATENT DOCUMENTS

| | | | |
|---|---|---|---|
| 10,938,369 B1* | 3/2021 | Gradinaru ................ | H03H 7/18 |
| 2016/0028146 A1* | 1/2016 | Zhang et al. ........... | H01P 5/184 |
| | | | 333/112 |
| 2017/0110779 A1* | 4/2017 | Hanaoka ................. | H03H 7/38 |

OTHER PUBLICATIONS

Meng, Yichao et al.; "A 45~85GHz broadband directional coupler on GaAs Technology"; https://ieeexplore.ieee.org/ document/ 8992235; IEEE, May 2019, 3 pages; International Conference on Microwave and Millimeter Wave Technology Proceedings (ICMMT).

* cited by examiner

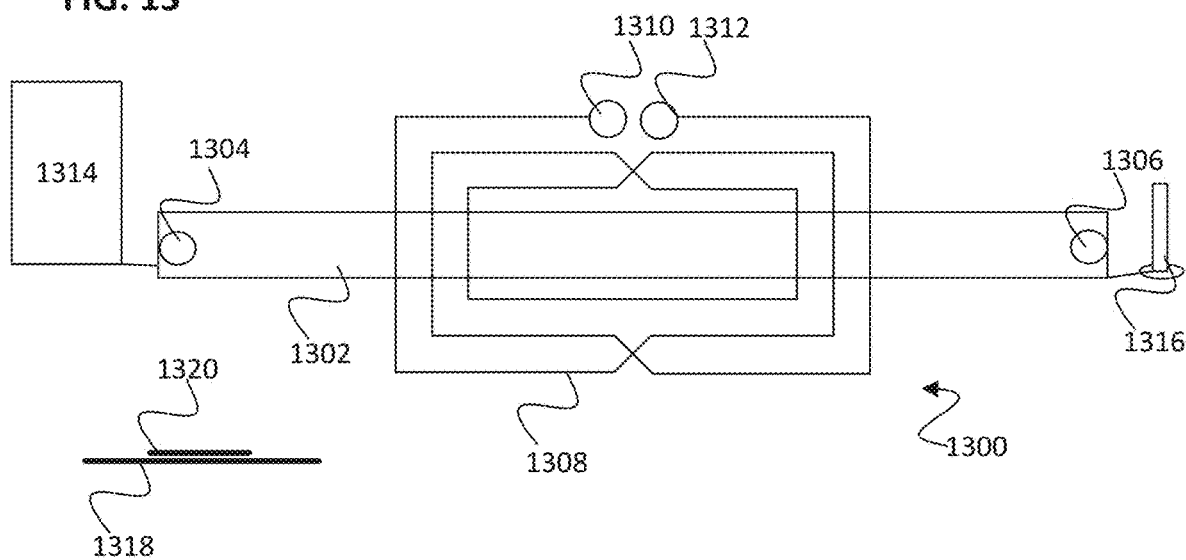

DIRECTIONAL COUPLER COMPRISING A FIRST LINEAR CONDUCTOR COUPLED TO A SECOND WINDING CONDUCTOR, SUCH THAT THE FIRST CONDUCTOR HAS A LENGTH LESS THAN ONE-QUARTER WAVELENGTH

TECHNICAL FIELD

Various aspects of this application relate to directional couplers, such as directional couplers for use in wireless radiofrequency communication.

BACKGROUND

Directional couplers may measure the power delivered from a power amplifier (PA) to an antenna, and measure the returned power from the antenna to the PA. Although a directional coupler would ideally couple a signal losslessly, real-world directional couplers may result in some level of signal loss. This loss is a key property of a directional coupler, since the loss results in reduced output power and diminishes a transmission chain efficiency. One key factor in the loss of a directional coupler is the length of the through port.

BRIEF DESCRIPTION OF DRAWINGS

The drawings are not necessarily to scale, emphasis instead generally being placed upon illustrating the principles of the invention. In the following description, various aspects are described with reference to the following drawings, in which:

FIG. 13 depicts a signal coupling system.

DETAILED DESCRIPTION OF THE INVENTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

The word "exemplary" is used herein to mean "serving as an example, instance, or illustration". Any aspect or design described herein as "exemplary" is not necessarily to be construed as preferred or advantageous over other aspects or designs.

Throughout the detailed description of the drawings, it should be noted that like reference numbers are used to depict the same or similar elements, features, and structures, unless otherwise noted.

The phrase "at least one" and "one or more" may be understood to include a numerical quantity greater than or equal to one (e.g., one, two, three, four, [ . . . ], etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of individual listed elements.

The words "plural" and "multiple" in the description and in the claims expressly refer to a quantity greater than one. Accordingly, any phrases explicitly invoking the aforementioned words (e.g., "plural [elements]", "multiple [elements]") referring to a quantity of elements expressly refers to more than one of the said elements. For instance, the phrase "a plurality" may be understood to include a numerical quantity greater than or equal to two (e.g., two, three, four, five, [ . . . ], etc.).

The phrases "group (of)", "set (of)", "collection (of)", "series (of)", "sequence (of)", "grouping (of)", etc., in the description and in the claims, if any, refer to a quantity equal to or greater than one, i.e., one or more. The terms "proper subset", "reduced subset", and "lesser subset" refer to a subset of a set that is not equal to the set, illustratively, referring to a subset of a set that contains less elements than the set.

The following detailed description refers to the accompanying drawings that show, by way of illustration, exemplary details and aspects in which aspects of the present disclosure may be practiced.

Figure 1:
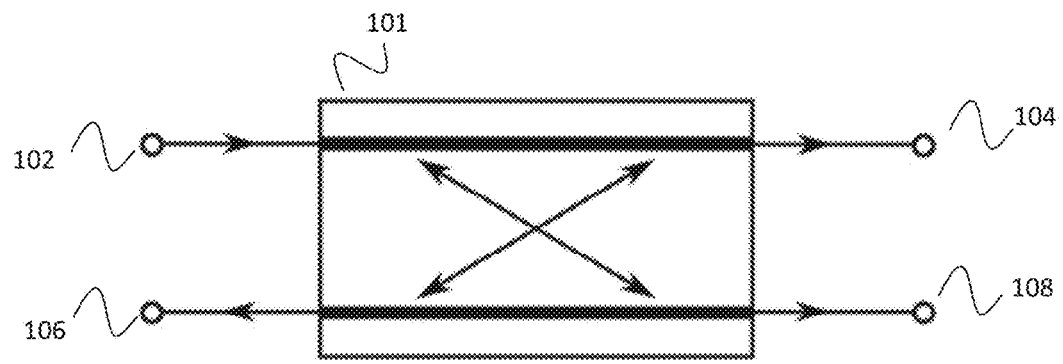
FIG. 1 depicts a conventional directional coupler.

FIG. 1 depicts a conventional directional coupler 101. The directional coupler 101 includes a main signal line, which is includes a main signal line input 102 (P1) and a main signal line throughput 104 (P2). The directional coupler 101 further includes a coupling line, which includes an isolated port 106 (P4) and a coupled port 108 (P3). The crisscrossed arrows between the main signal line and the coupling line indicate a coupling action.

Directional couplers exhibit a coupling factor $C_{3,1}$ (for a signal received at port 3 and originating at port 1), which may be calculated as:

$$C_{3,1} = 10\log\left(\frac{P_3}{P_1}\right) dB \quad (1)$$

wherein $P_1$ is the power at the main signal line input 102, and $P_3$ is the output power at the coupled port 108. The coupling factor is a negative number, as it cannot exceed 0 dB in a passive device. It is noted that although the coupling factor is a negative number, the negative sign is often omitted in this disclosure for reasons of convenience. To the extent that a coupling factor appears in this disclosure as a positive number, this is merely due to an intentional omission of a negative sign and is not intended to convey that the coupling factor is indeed positive.

Directional couplers exhibit insertion loss between the power $P_1$ at the main signal input line 102 and the power $P_2$ at the main signal throughout 104. The skilled person will appreciate that insertion loss is generally understood as signal power loss (typically given in decibels) resulting from insertion of a device within a transmission line. The insertion loss $L_{i2,1}$ (for a signal received at port 2 and originating at port 1) may be calculated as:

$$L_{i2,1} = -10\log\left(\frac{P_2}{P_1}\right) dB \quad (2)$$

Another aspect of power loss may be understood as coupling loss, which may generally be understood as a power loss resulting from connection between circuits. The coupling loss $L_{c2,1}$ (for a signal received at port 2 and originating at port 1) of the directional coupler may be calculated as:

$$L_{c2,1} = -10\log\left(1 - \frac{P_3}{P_1}\right) dB \quad (3)$$

Directional couplers are conventionally configured as λ/4-couplers, in which the directional coupler is configured to transmit a signal having a predetermined wavelength (λ), and wherein the main signal line length (e.g. including the main signal line input 102 ($P_1$) and the main signal line throughput 104 ($P_2$)) is one-fourth the operating wavelength (e.g. λ/4). A signal (e.g. a signal from an amplifier to an antenna, or a signal from an antenna to an amplifier) flows through the main signal line, and the forward and reverse signals are captured in two sides of the coupled transmission line.

A conventional directional coupler implemented according to this λ/4 configuration, and operating within the millimeter wave range (e.g. operating using wavelengths of approximately 1 millimeter to approximately 10 millimeters, or using frequencies of approximately 300 GHz to approximately 30 GHz will typically have a loss of approximately 1 dB (or approximately 20%). This may represent a significant disadvantage or problem to be overcome in the use of directional couplers.

As circuits improve efficiency, their power budgets decrease, and it becomes increasingly necessary to reduce loss. Thus, in some circumstances, a coupling loss of approximately 1 dB may be undesirable or unacceptable, and it is therefore necessary to further reduce loss.

The primary contributor to loss within a directional coupler is the length of the main signal line (e.g. between $P_1$ and $P_2$). Because the length of the main signal line has conventionally been determined by the wavelength for which the directional coupler is configured (e.g. λ/4), reducing the loss by reducing the length of the main signal line in a directional coupler as depicted in FIG. 1, has presented difficulties and has otherwise proved limiting or even impossible.

Figure 2:
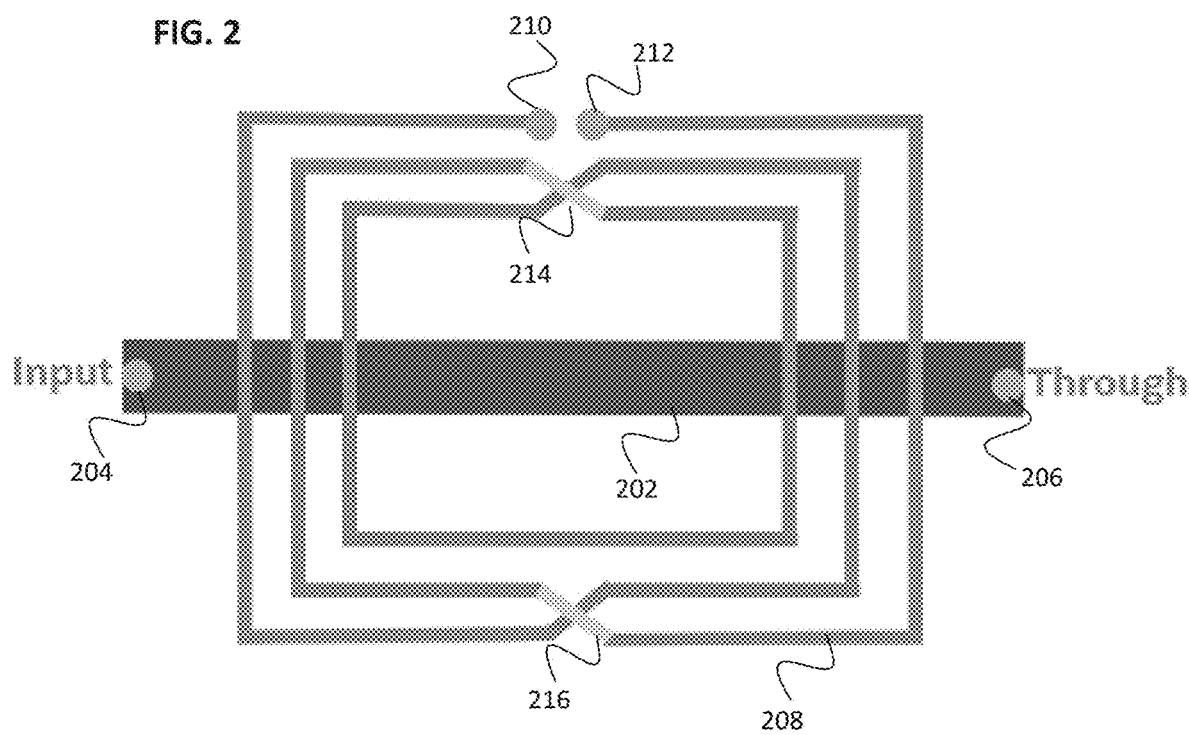
FIG. 2 depicts a directional coupler according to this disclosure.

FIG. 2 depicts a directional coupler according to this disclosure. This directional coupler has a reduced main signal line length and thus reduces loss compared to the conventional directional coupler in FIG. 1. This directional coupler includes a low inductance and low loss main signal line 202 including a main signal line input 204 and a main signal line throughput 206. The directional coupler further includes a coupling line 208, which is configured as a symmetrical inductor coupled to the main signal line input, which further includes an isolated port 210 and a coupled port 212. Of note, the coupling line 208 is generally configured as a coil. In FIG. 2, the coupling line 208 is presented as a coil essentially having three loops; however, the number of loops depicted within FIG. 2 are not intended to be limiting, and it is specifically stated that the number of loops may increase or decrease, depending on the length of the conductor for the coupling line 208 and/or the distance between conductors within the loop. Furthermore, the skilled person may selected the dimensions of the coupling line 208 (e.g. a length and/or width of the coupling line/ inductor coil, the distance between adjacent windings, etc.) for a given configuration or implementation. The coupler may include two overlapping sections of conductor 214 and 216. These overlapping sections of conductor are isolated from one another, such that a galvanic electrically conductive connection does not result from contact between the overlapping conductors of 214 and 216. The coupling line 208 may exhibit these overlapping sections such that the ends 210 and 212 are adjacent to one another, as opposed to a conventional loop configuration in which one end is located in an interior portion of the loop, and the other end is located in an exterior portion of the loop. Although these overlapping sections 214 and 216 are depicted herein, it is believed that the skilled person may appreciate other configurations (e.g. other numbers of overlapping sections The directional coupler of FIG. 2 is advantageous at least because of the low loss thereof. Such directional couplers may be used, for example, in radiofrequency transmission and reception, in which the directional coupler is placed between a transceiver/power amplifier and antenna. In such configurations, and assuming a radiofrequency transmission, the output power at the antenna will be greater using the directional coupler of FIG. 2 than using a conventional directional coupler (e.g. the directional coupler of FIG. 1). Otherwise stated, the directional coupler of FIG. 2 permits higher power at the antenna compared to the conventional directional coupler of FIG. 1, while maintaining the same power consumption of the PA. This results in improved transmission chain efficiency. Conversely, in a radiofrequency reception situation, the power received at the transceiver/low noise amplifier will be greater using the directional coupler of FIG. 2 than using a conventional directional coupler (e.g. the directional coupler of FIG. 1). Furthermore, the overall receiver noise figure will be lower using the directional coupler described herein, compared to that of a conventional coupler. That is, the directional coupler structure of FIG. 2 exhibits very low loss (e.g. 0.15 dB) without compromising the directivity (e.g. >22 dB). The directional coupler of FIG. 2 achieves this very low power loss by reducing the main signal path 202 length and that inductance of the coupling line 208.

Figure 3:
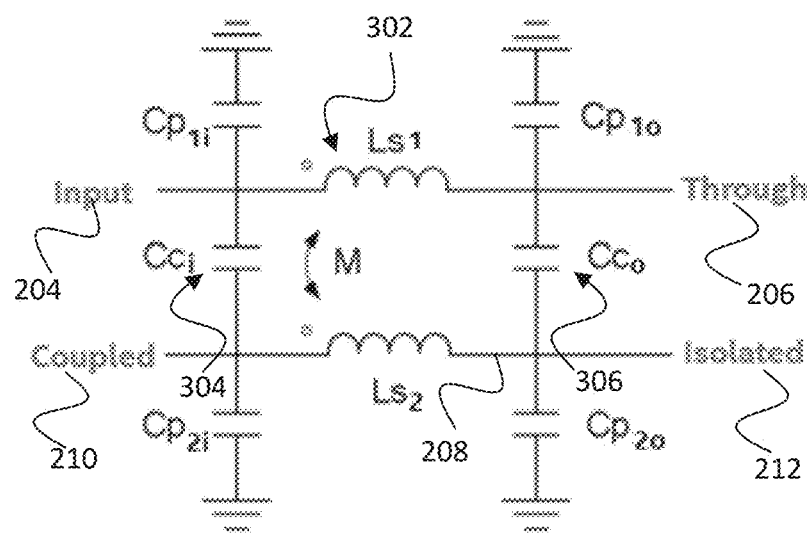
FIG. 3 depicts a lumped-element model of the directional coupler of FIG. 2.

FIG. 3 depicts a lumped-element model of the directional coupler of FIG. 2. In detail, FIG. 3 depicts a main signal line including an input 204 and throughput 206, and a coupling element 208 including a coupled input 210 and an isolated input 212. An inductive coupling between the main signal line (between 204 and 206) and the coupling element 208 is depicted as 302. Furthermore, capacitive coupling between the main signal line (between 204 and 206) and the coupling element 208 is depicted as 304 and 306. The reference "M" in FIG. 3 refers to the mutual inductance of the path from the input 204 to the throughput 206 relative to the path from the coupled input 210 to the isolated input 212.

According to first exemplary configuration, the direction coupler may be configured such that $Cp1i=Cp1o=2$ fF; $Ls1=23$ pH; $Q1=19$; $Cci=Cco=2.7$ fF; $K=0.15$, $Ls2=210$ pH $Q2=4.7$; and $Cp2i=Cp2o=3.7$ fF, wherein C is capacitance, L is inductance, K is the coupling coefficient, and Q1/Q2 is the quality factor of the inductors L1/L2 respectively. In order to achieve desirable coupling and directivity from a main signal line while using such low inductance, the directional coupler relies on a particular structure. This structure is represented as Ls2 in FIG. 3 in conjunction with the coupler of FIG. 2. This coupler of FIG. 3 actually has a much higher inductance (210 pH in the implementation according to FIG. 3). Whatever the inductance of the coupler for a given implementation, the coupler is a symmetrical inductor and it is centered around the main signal line.

Figure 4:
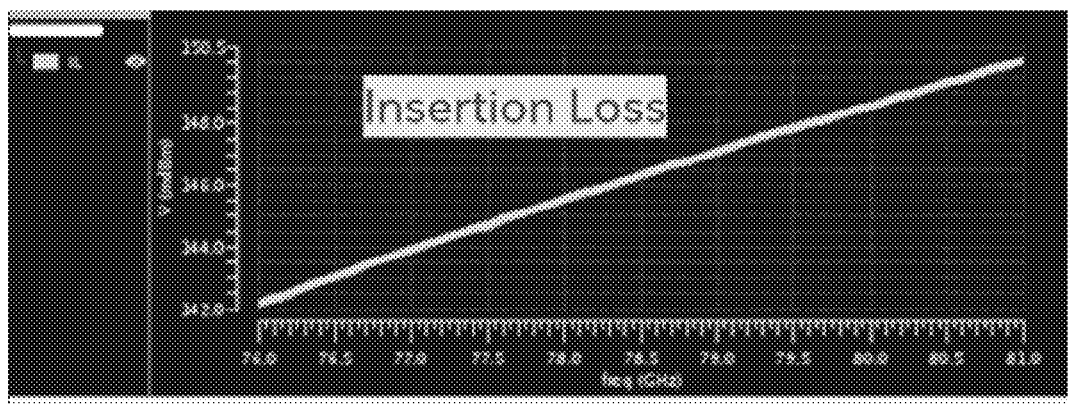
FIG. 4 depicts insertion loss for the directional coupler of FIG. 2, according to an exemplary implementation.

FIGS. 4-7 depict simulated results of insertion loss, coupling factor, directivity, and isolation, respectively, of the directional coupler of FIG. 2 having the parameters depicted relative to FIG. 3. In FIG. 4, insertion loss is depicted as ranging linearly from approximately 142.0 mdB at 76.0 GHz to 150.5 mdB at 81.0 GHz.

Figure 5:
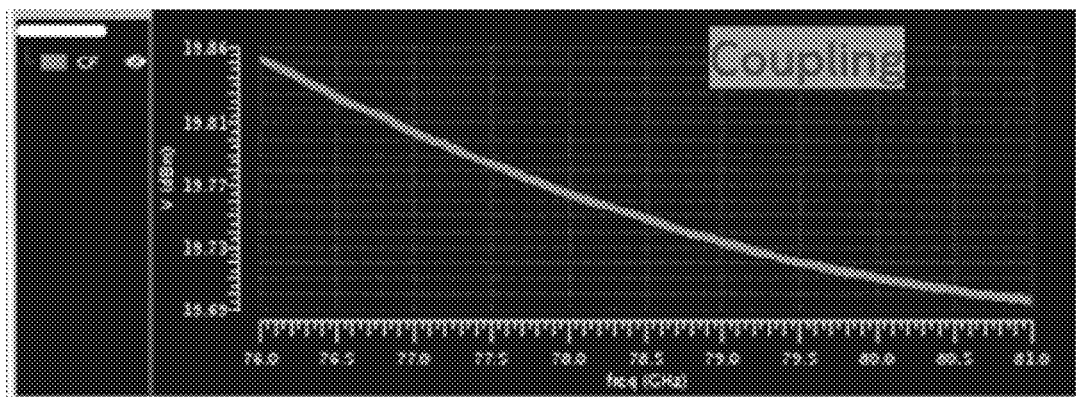
FIG. 5 depicts coupling for the directional coupler of FIG. 2, according to an exemplary implementation.
Figure 6:
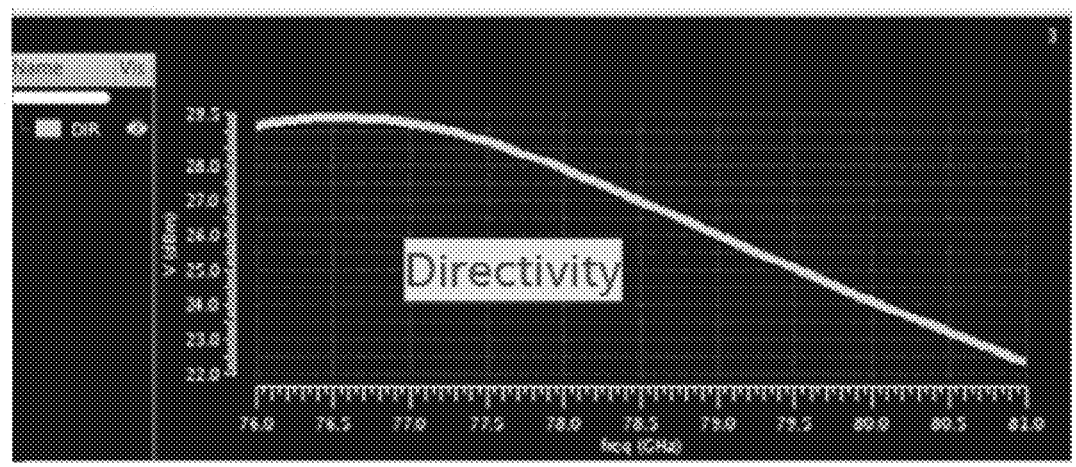
FIG. 6 depicts directivity for the directional coupler of FIG. 2, according to an exemplary implementation.
Figure 7:
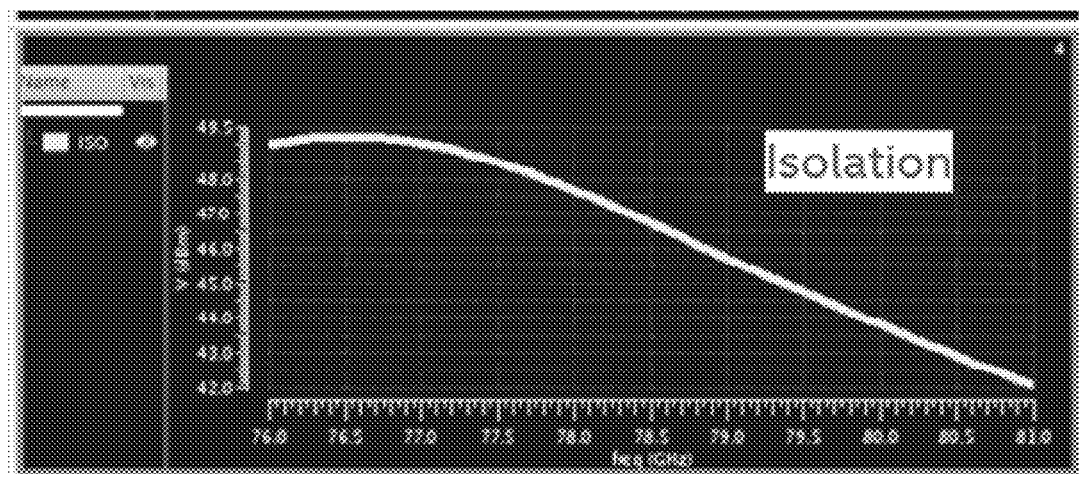
FIG. 7 depicts isolation for the directional coupler of FIG. 2, according to a first exemplary implementation.
Figure 8:
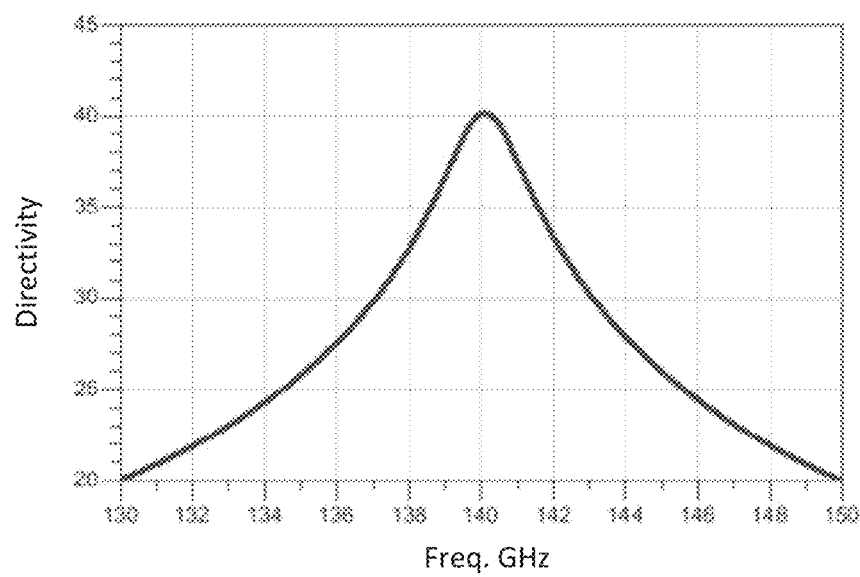
FIGS. 8-11 depict directivity, insertion loss, coupling, and isolation respectively of the directional coupler according to the second exemplary implementation.
Figure 9:
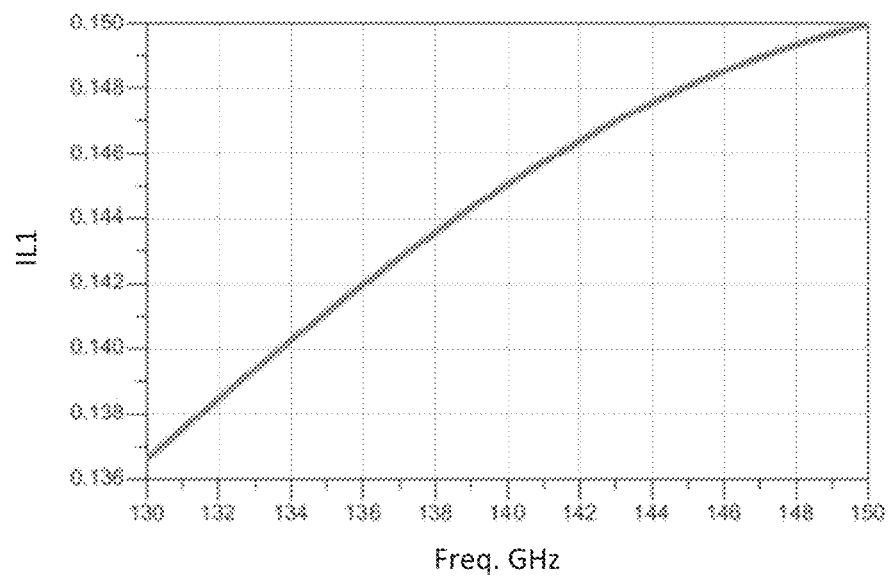
Figure 10:
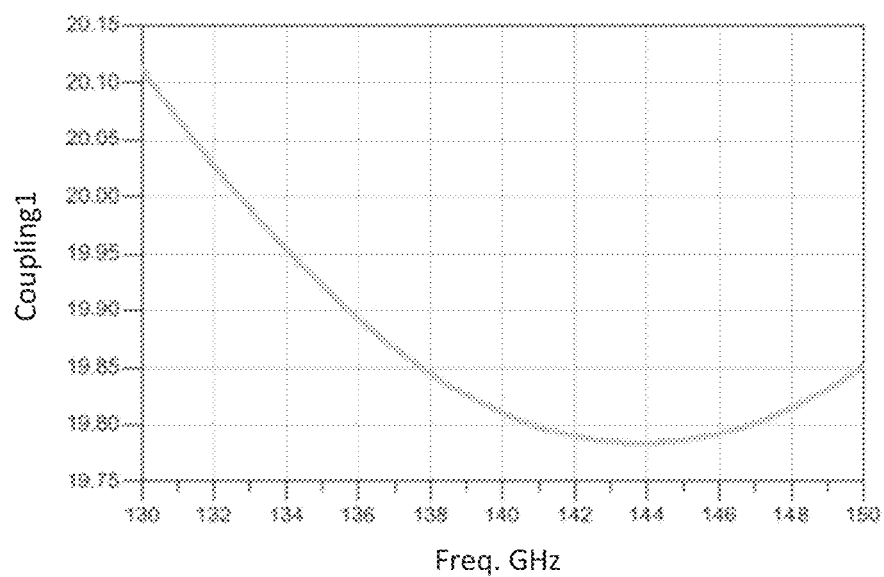
Figure 11:
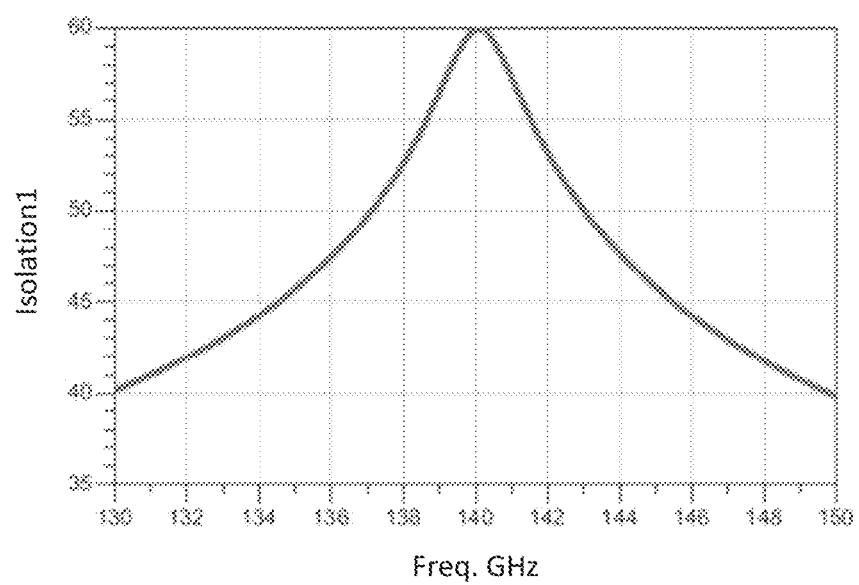

FIG. 5 depicts a non-linear curve depicting a coupling factor of 19.86 dB at 76.0 GHz to 19.69 dB at 81.0 GHz. FIG. 6 depicts a non-linear curve showing directivity, ranging from approximately 29 V (dBm) at 76.0 GHz, to a maximum of approximately 29.5 dB at approximately 76.5 GHz, to a low of approximately 22.5 dB at 81.0 GHz. FIG. 7 depicts isolation ranging from approximately 49.0 dB at 76.0 GHz, to a maximum of approximately 49.5 dB at approximately 76.5 GHz, and then dropping approximately linearly to approximately 42.0 dB at 81.0 GHz.

Alternatively or additionally, the directional coupler of FIG. 2. may be utilized in radar, such as, for example, high-resolution radar having massive antenna arrays. In this case, the directional coupler is an essential component for calibrations. In a second exemplary implementation of the directional coupler, the directional coupler was configured for utilization at 140 GHz as follows: $p1i=Cp1i=5.5$ fF; $Ls1=8.2$ pH; $Q1=16$; $Cci=Cco=2.9$ fF; $K=0.17$; $Ls2=115$ pH; $Q2=4$; $Cp2i=Cp2o=0.6$ fF. This directional coupler continued to exhibit low loss and good directivity. FIGS. 8-11 depict directivity, insertion loss (i.e. IL1), coupling (i.e. coupling1), and isolation (isolation1), respectively of the directional coupler according to the second exemplary implementation. Otherwise stated, when configured for the automotive radar band of 140 GHz, the directional coupler of FIG. 2 similarly exhibited low loss (less than 0.15 dB) and high directivity of more than 20 dB from 130 GHz-150 GHz. For each of FIGS. 8, 9, 10, and 11, the use of "Freq. GHz" refers to the frequency in gigahertz.

The directional coupler of FIG. 2 exhibits reduced loss and improved directivity within a variety of processes. For example, in testing using 16FF (16 nm FinFET (Fin Field-Effect Transistor) process technology) and Silicon on Insulator (SOI) processes, the directional coupler performed similarly to that which is described herein (e.g. reduced loss and satisfactory or improved directivity compared to a conventional directional coupler).

Figure 12:
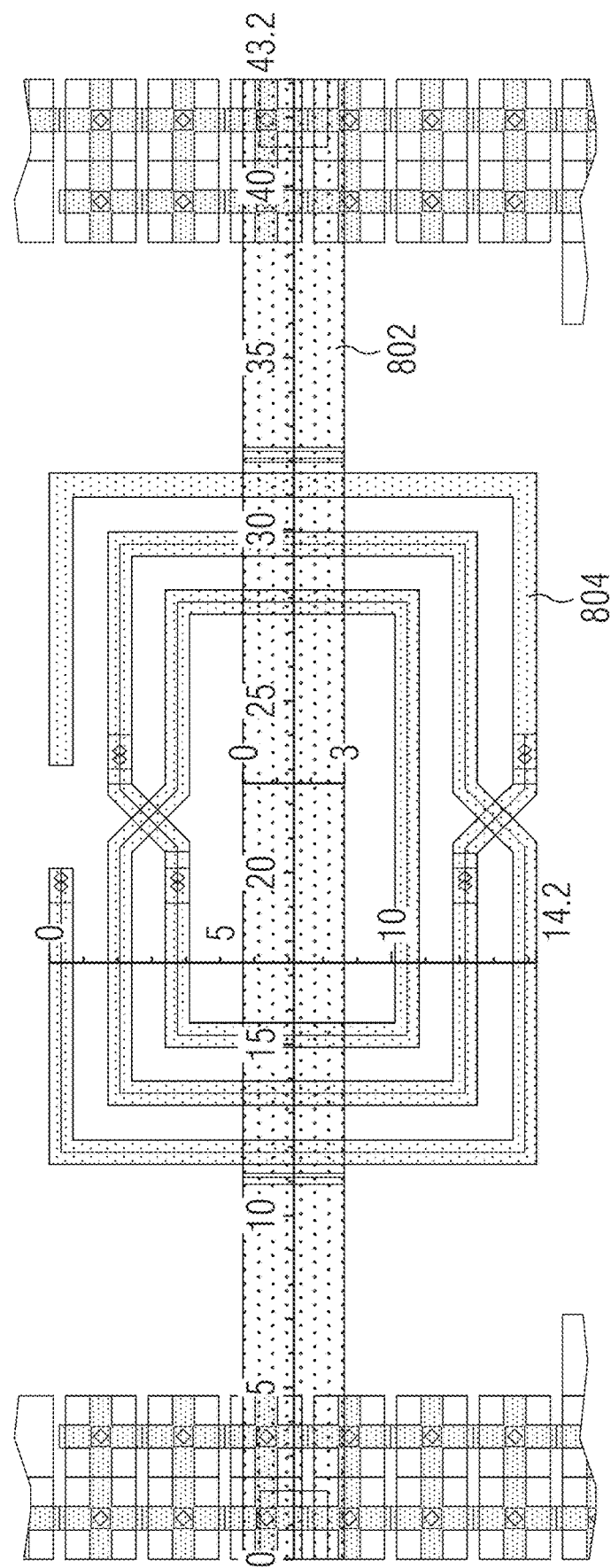
FIG. 12 depicts an exemplary configuration of the directional coupler of FIG. 2.

FIG. 12 depicts a third exemplary configuration of the directional coupler of FIG. 2. Of course, the main signal line and the coupling line may be configured with any of a variety of lengths and sizes depending on the design of the directional coupler. In this particular configuration, however, the main signal line 802 is approximately 43.2 microns long. The coupling line 804 in this exemplary configuration is depicted as being approximately 21 microns long and 14.2 microns wide.

FIG. 13 depicts a signal coupling system, including a directional coupler 1300, including a first conductor 1302, the first conductor including a first end 1304 and a second end 1306; and generally arranged along a first plane 1318; and a second conductor, the second conductor 1308 including a third end 1310 and a fourth end 1312; and generally arranged as a plurality of windings along a second plane 1320; a transceiver 1314, electrically conductively conducted to the first end; and an antenna 1316, electrically conductively conducted to the second end; wherein the second conductor 1308 is configured to generate a coupling with the first conductor when the first conductor conducts an electric signal; and wherein, when the transceiver 1314 conducts a first electric signal to the first end 1304 at a first power, the directional coupler 1300 is configured to conduct the first electrical signal from the first end 1304 to the second end 1306 at a second power, and to conduct the electrical signal via the coupling to the third end 1310 at a third power.

In addition or in combination with any one of the features mentioned in this or the preceding paragraph, the signal coupling system may be configured such that when the antenna conducts a second electric signal to the second end at a fourth power, the directional coupler is configured to conduct the second electrical signal from the second end to the first end at a fifth power, and to conduct the electrical signal via the inductive coupling to the fourth end at a sixth power. In addition or in combination with any one of the features mentioned in this or the preceding paragraph, the directional coupler may be configured to conduct an electric signal having an operational frequency, and wherein a length of the first conductor is shorter than one-fourth of a wavelength of the operational frequency. In addition or in combination with any one of the features mentioned in this or the preceding paragraph, an inductance of the first conductor may be approximately one-tenth an inductance of the second conductor. In addition or in combination with any one of the features mentioned in this or the preceding paragraph, no electrically conductive connection may exist between the first conductor and the second conductor. In addition or in combination with any one of the features mentioned in this or the preceding paragraph, the first conductor may be arranged linearly and/or be a linear conductor (e.g. in a line, in a single, straight conductive path, etc.). In addition or in combination with any one of the features mentioned in this or the preceding paragraph, the second plane may be above or below the first plane. In addition or in combination with any one of the features mentioned in this or the preceding paragraph, a difference between the first power and the second power is less than 0.15 dB. In addition or in combination with any one of the features mentioned in this or the preceding paragraph, the operational frequency may be between 76 GHz and 81 GHz or between 130 GHz and 150 GHz, wherein the first conductor will have a length of less than one-fourth a wavelength of the operational frequency. The directional coupler described herein is not limited to the frequency ranges explicitly included herein, but rather may be implemented in a larger variety of frequencies as desired for a given implementation.

The directional coupler may be configured without the transceiver 1314 and/or the antenna 1316, such that the directional coupler includes a first conductor, including a first end and a second end; and generally arranged along a first plane; and a second conductor: including a third end and a fourth end; and generally arranged as a plurality of windings along a second plane; wherein the second conductor is configured to generate a coupling with the first conductor when the first conductor conducts an electric signal; and wherein, when the first end is configured to receive a first electrical signal at a first power, the directional coupler is configured to conduct the first electrical signal from the first end to the second end at a second power, and to conduct the electrical signal via the coupling to the third end at a third power. The directional coupler of this paragraph may be combined with any feature of the directional coupling system of the preceding two paragraphs.

According to an aspect of the disclosure, any of the concepts disclosed herein may be implemented as a directional coupling means, including conducting means and a second conducting means, wherein the first conducting means includes a first end and a second end; and is generally arranged along a first plane; and wherein the second conducting means includes a third end and a fourth end; and is generally arranged as a plurality of windings along a second plane; wherein the second conducting means is configured to generate a coupling with the first conductor when the first conductor conducts an electric signal; and wherein, when the first end is configured to receive a first electrical signal at a first power, the directional coupling means is configured to conduct the first electrical signal from the first end to the second end at a second power, and to conduct the electrical signal via the coupling to the third end at a third power.

Further aspects of the disclosure will be provided by way of examples:

In Example 1, a signal coupling system, including: a directional coupler, including: a first conductor: including a first end and a second end; and generally arranged along a first plane; a second conductor: including a third end and a fourth end; and generally arranged as a plurality of windings along a second plane; a transceiver, electrically conductively conducted to the first end; and an antenna, electrically conductively conducted to the second end; wherein the second conductor is configured to generate a coupling with the first conductor when the first conductor conducts an electric signal; and wherein, when the transceiver conducts a first electric signal to the first end at a first power, the directional coupler is configured to conduct the first electrical signal from the first end to the second end at a second power, and to conduct the electrical signal via the coupling to the third end at a third power.

In Example 2, the signal coupling system of Example 1, wherein, when the antenna conducts a second electric signal to the second end at a fourth power, the directional coupler is configured to conduct the second electrical signal from the second end to the first end at a fifth power, and to conduct the electrical signal via the inductive coupling to the fourth end at a sixth power.

In Example 3, the signal coupling system of Example 1 or 2, wherein the directional coupler is configured to conduct an electric signal having an operational frequency, and wherein a length of the first conductor is shorter than one-fourth of a wavelength of the operational frequency.

In Example 4, the signal coupling system of any one of Examples 1 to 3, wherein an inductance of the first conductor is approximately one-tenth of an inductance of the second conductor.

In Example 5, the signal coupling system of any one of Examples 1 to 4, wherein no electrically conductive connection exists between the first conductor and the second conductor.

In Example 6, the signal coupling system of any one of Examples 1 to 5, wherein the first conductor is arranged linearly.

In Example 7, the signal coupling system of any one of Examples 1 to 6, wherein the second plane is above or below the first plane.

In Example 8, the signal coupling system of any one of Examples 1 to 7, wherein a difference between the first power and the second power is less than 0.15 dB.

In Example 9, the signal coupling system of any one of Examples 3 to 8, wherein the operational frequency is between 130 GHz and 150 GHz, and the first conductor has a length of less than one-fourth a wavelength of the operational frequency.

In Example 10, the signal coupling system of Example 9, wherein the operational frequency is 76 GHz and 81 GHz, and the first conductor has a length of less than one-fourth a wavelength of the operational frequency.

In Example 11, a directional coupler, including: a first conductor: including a first end and a second end; and generally arranged along a first plane; a second conductor: including a third end and a fourth end; and generally arranged as a plurality of windings along a second plane; wherein the second conductor is configured to generate a coupling with the first conductor when the first conductor conducts an electric signal; and wherein, when the first end is configured to receive a first electrical signal at a first power, the directional coupler is configured to conduct the first electrical signal from the first end to the second end at a second power, and to conduct the electrical signal via the coupling to the third end at a third power.

In Example 12, the directional coupler of Example 11, wherein the directional coupler is further configured to conduct a second electrical signal from the second end to the first end at a fifth power, and to conduct the second electrical signal via the inductive coupling to the fourth end at a sixth power.

In Example 13, the signal coupling system of Example 11 or 12, wherein the directional coupler is configured to conduct an electric signal having an operational frequency, and wherein a length of the first conductor is shorter than one-fourth of a wavelength of the operational frequency.

In Example 14, the signal coupling system of any one of Examples 11 to 13, wherein an inductance of the first conductor is approximately one-tenth of an inductance of the second conductor.

In Example 15, the signal coupling system of any one of Examples 11 to 14, wherein no electrically conductive connection exists between the first conductor and the second conductor.

In Example 16, the signal coupling system of any one of Examples 11 to 15, wherein the first conductor is arranged linearly.

In Example 17, the signal coupling system of any one of Examples 11 to 16, wherein the second plane is above or below the first plane.

In Example 18, the signal coupling system of any one of Examples 11 to 17, wherein a difference between the first power and the second power is less than 0.15 dB.

In Example 19, the signal coupling system of any one of Examples 13 to 18, wherein the operational frequency is between 130 GHz and 150 GHz, and the first conductor has a length of less than one-fourth of a wavelength of the operational frequency.

In Example 20, the signal coupling system of Example 19, wherein the operational frequency is 76 GHz and 81 GHz, and the first conductor has a length of less than one-fourth of a wavelength of the operational frequency.

While the disclosure has been particularly shown and described with reference to specific aspects, it should be understood by those skilled in the art that various changes in form and detail may be made therein without departing from the spirit and scope of the disclosure as defined by the appended claims. The scope of the disclosure is thus indicated by the appended claims and all changes, which come within the meaning and range of equivalency of the claims, are therefore intended to be embraced.

What is claimed is:

1. A signal coupling system, comprising:
a directional coupler, comprising:
   a first conductor:
      comprising a first end and a second end; and
      arranged along a first plane;
   a second conductor:
      comprising a third end and a fourth end; and
      arranged as a plurality of windings along a second plane;
a transceiver, operably conducted to the first end; and
an antenna, operably conducted to the second end;
wherein the second conductor is configured to couple to the first conductor for an electrical signal conductivity at the first conductor; and
wherein, the directional coupler is further configured to conduct a first electrical signal from the first end at a first power to the second end at a second power, and to couple the first electrical signal to the third end at a third power;
wherein the directional coupler is configured to have an operational frequency, and wherein a length of the first conductor is shorter than one-fourth of a wavelength of the operational frequency.

2. The signal coupling system of claim 1, wherein the directional coupler is configured to conduct a second electrical signal, received at the second end at a fourth power, from the second end to the first end at a fifth power, and to conduct the second electrical signal via inductive coupling to the fourth end at a sixth power.

3. The signal coupling system of claim 1, wherein the operational frequency is 76 GHz and 81 GHz, and the first conductor has a length of less than one-fourth a wavelength of the operational frequency.

4. The signal coupling system of claim 1, wherein an inductance of the first conductor is approximately one-tenth of an inductance of the second conductor.

5. The signal coupling system of claim 1, wherein no direct, electrically conductive connection exists between the first conductor and the second conductor.

6. The signal coupling system of claim 1, wherein the first conductor is arranged linearly.

7. The signal coupling system of claim 1, wherein the second plane is above or below the first plane.

8. The signal coupling system of claim 1, wherein a difference between the first power and the second power is less than 0.15 dB.

9. The signal coupling system of claim 1, wherein the operational frequency is between 130 GHz and 150 GHz.

10. A directional coupler, comprising:
a first conductor:
   comprising a first end and a second end; and
   arranged along a first plane;
a second conductor:
   comprising a third end and a fourth end; and
   arranged as a plurality of windings along a second plane;
wherein the second conductor is configured to couple to the first conductor for an electrical signal conductivity at the first conductor; and
wherein, the directional coupler is further configured to conduct a first electrical signal from the first end at a first power to the second end at a second power, and to couple to the third end at a third power the first electrical signal;
wherein the directional coupler is configured to have an operational frequency, and wherein a length of the first conductor is shorter than one-fourth of a wavelength of the operational frequency.

11. The signal coupling system of claim 10, wherein the operational frequency is 76 GHz and 81 GHz.

12. The directional coupler of claim 10, wherein the directional coupler is further configured to conduct a second electrical signal from the second end to the first end at a fifth power, and to conduct the second electrical signal via inductive coupling to the fourth end at a sixth power.

13. The signal coupling system of claim 10, wherein the operational frequency is between 130 GHz and 150 GHz.

14. The signal coupling system of claim 10, wherein an inductance of the first conductor is approximately one-tenth of an inductance of the second conductor.

15. The signal coupling system of claim 10, wherein no direct, electrically conductive connection exists between the first conductor and the second conductor.

16. The signal coupling system of claim 10, wherein the first conductor is arranged linearly.

17. The signal coupling system of claim 10, wherein the second plane is above or below the first plane.

18. The signal coupling system of claim 10, wherein a difference between the first power and the second power is less than 0.15 dB.

* * * * *